(12) United States Patent
Duesman et al.

(10) Patent No.: US 6,319,756 B2
(45) Date of Patent: Nov. 20, 2001

(54) HEAT SINK FOR CHIP STACKING APPLICATIONS

(75) Inventors: Kevin G. Duesman; L. Jan Bissey, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/741,822

(22) Filed: Dec. 22, 2000

Related U.S. Application Data

(62) Division of application No. 09/178,480, filed on Oct. 26, 1998, now Pat. No. 6,201,695.

(51) Int. Cl.⁷ .................................................. H01L 21/44
(52) U.S. Cl. ......................... 438/122; 438/106; 438/121; 361/703
(58) Field of Search .................................... 438/121, 122, 438/109, 106, 107; 361/203

(56) References Cited

U.S. PATENT DOCUMENTS

| | | | |
|---|---|---|---|
| 5,228,192 | * 7/1993 | Salatino | 29/827 |
| 5,276,584 | * 1/1994 | Collins et al. | 361/718 |
| 5,567,986 | 10/1996 | Ishida | 257/707 |
| 5,719,745 | 2/1998 | Agonafer et al. | 361/704 |
| 5,751,553 | 5/1998 | Clayton | 361/749 |
| 5,757,073 | 5/1998 | Hoffmeyer | 257/700 |
| 5,779,134 | 7/1998 | Watson et al. | 228/179.1 |

* cited by examiner

*Primary Examiner*—John F. Niebling
*Assistant Examiner*—Christopher Lattin
(74) *Attorney, Agent, or Firm*—Dickstein, Shapiro, Morin & Oshinsky, LLP

(57) ABSTRACT

A heat sink is provided for use with stacks of integrated chips. The heat sink includes a thermally conductive body having a heat absorbing section which is inserted within the chip stack, and heat transfer and dissipating sections which are located outside of the chip stack.

25 Claims, 10 Drawing Sheets

HEAT SINK FOR CHIP STACKING APPLICATIONS

This application is a divisional application of application Ser. No. 09/178,480 filed on Oct. 26, 1998, now U.S. Pat. No. 6,201,695, which is hereby incorporated by reference.

BACKGROUND OF THE INVENTION

1. Field of the Invention

The present invention relates to the field of integrated circuits. More particularly, the invention provides a heat sink for use with stacks of integrated circuits.

2. Description of the Related Art

As computer manufacturers have attempted to build more powerful machines, the use of chip stacks in modem computing applications has become increasingly desirable. The term 'chips' used with the present invention is intended to include any packaged integrated circuit device including processing devices e.g. microprocessors etc., memory devices e.g. DRAMS, SRAMS, etc., and the like. In essence, a chip stack comprises multiple integrated circuit packages which are stacked together (back-to-front or back-to-back). The chip stacks may be oriented either in face up position or in a side-to-side orientation with chip edges down.

There are a number of advantages to the chip stack configuration over conventional single chip mounting arrangements. In particular, the chip stacks provide a more compact circuit arrangement for computers and other high speed electronic systems.

In addition, chip stacks particularly allow for more efficient use of space on circuit boards. The stack takes advantage of relatively less valuable space above the circuit board, while at the same time leaving a small footprint on a circuit board or card, thereby increasing the space available for other components or chip stacks.

While there are numerous advantages to a stacked chip configuration, there are also associated problems. Specifically, larger and larger chip stacks create unique cooling problems. Because the chip stacks contain multiple chips, they generate more heat per unit volume, requiring greater heat dissipation, while at the same time providing significantly smaller surface areas which may be used as a heat sink. In view of this problem, the general response in the industry to the need for cooling chip-stacks has been to immerse the entire chip-stack in liquid or to operate at greatly reduced power levels. This is often an unwelcome solution because of technical concerns and also because of customer and user preferences.

SUMMARY OF THE INVENTION

The present invention is generally directed at providing a relatively low cost heat sink for dissipating heat generated within chip stacks (sometimes referred to as 'chip cubes', although a cubic structure is not necessary). The invention provides a heat absorbing surface between at least a first and second chip within a chip stack which is connected to a heat dissipating surface located outside the stack. According to a preferred embodiment, the heat sink includes one or more heat absorbing sections for respective insertion between chips within one or more chip stacks; a heat transfer section for transferring heat away from the absorbing sections; and a heat dissipating section for commonly dissipating heat transferred from the heat absorbing sections.

These and other features and advantages of the invention will become more readily apparent from the following detailed description of preferred embodiments of the invention which are provided in connection with the accompanying drawings.

DETAILED DESCRIPTION OF PREFERRED EMBODIMENTS

Figure 1:
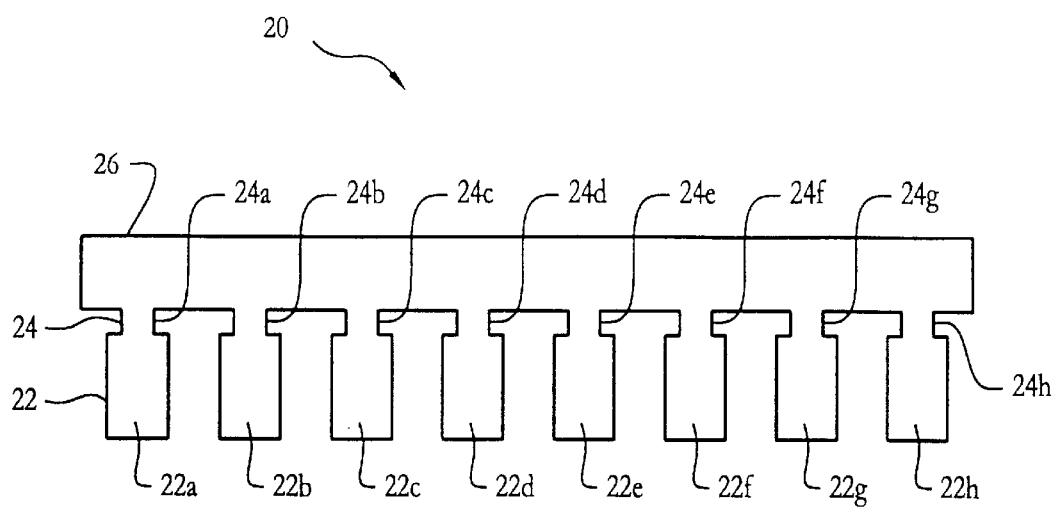
FIG. 1 is a plan view of a heat sink of a first embodiment of the invention.
Figure 2:
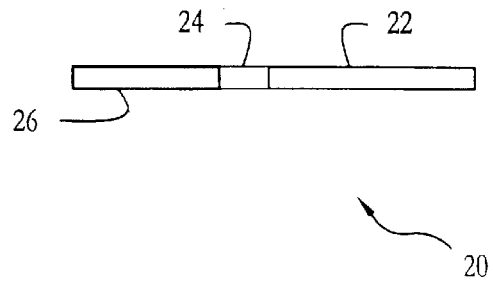
FIG. 2 is a side view of the heat sink shown in FIG. 1.

Referring to FIG. 1, a planar heat sink 20 in accordance with a preferred embodiment of the invention will now be described. Heat sink 20 is shown including three interconnected co-planar sections: a heat absorbing section 22, a heat transfer section 24, and a heat dissipating section 26. FIG. 2 is a side view of heat sink 20 showing the relative lateral dimensions of the heat absorbing section 22, heat transfer section 24, and heat dissipating section 26.

Heat absorbing section 22 includes one or more fingers 22a–22h, each of which is configured to be insertable between chips of a chip stack. Heat transfer section 24 includes heat transfer elements 24a–24h. The fingers 22a–22h remove heat from the chip stack, which flows through respective heat transfer sections 24a–24h to dissipation section 26. Preferably, fingers 22a–22h are of a generally rectangular shape and sized to maximize heat absorption from a target chip's surface. As shown in FIG. 1, the width of the fingers 22a–22h is larger than the width of the heat transfer elements 24a–24h. Alternatively, the width of the fingers 22a–22h may be the same, narrower or wider than the width of the heat transfer elements 24a–24h.

Preferably, heat sink 20 is comprised of a thermally conductive material having a thermal rate of expansion approximately equal to the thermal expansion rate of the stacked chips. In accordance with a preferred embodiment, heat sink 20 is comprised of a metal such as aluminum or copper and may be easily stamped out of plate metal. In alternative embodiments, it is possible for each of the three sections of heat sink 20 to be formed of different materials in accordance with each section's functional constraints.

Figure 3:
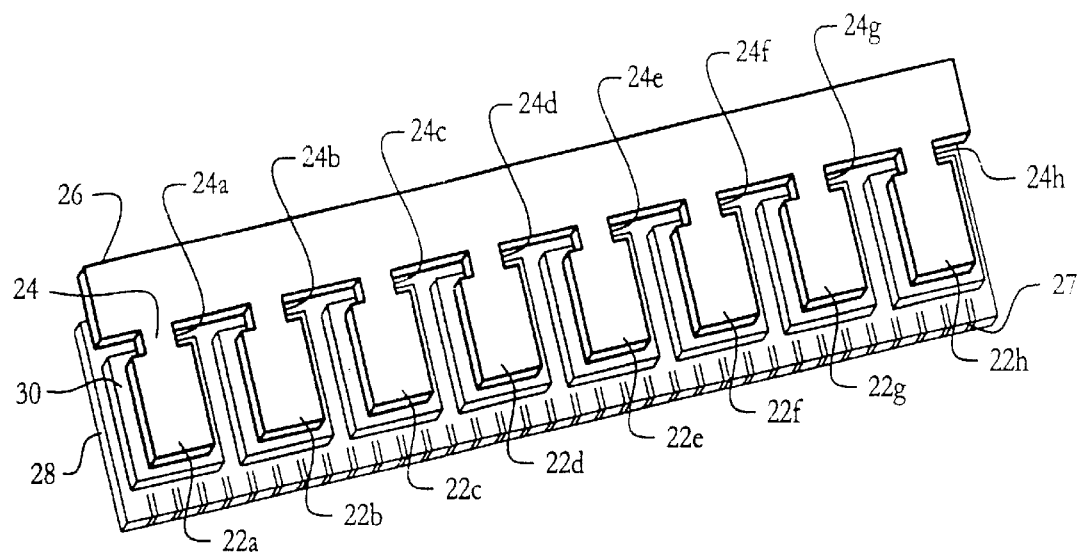
FIG. 3 is a respective view of the heat sink of FIG. 1 secured to chips on a chip mounting surface.
Figure 4:
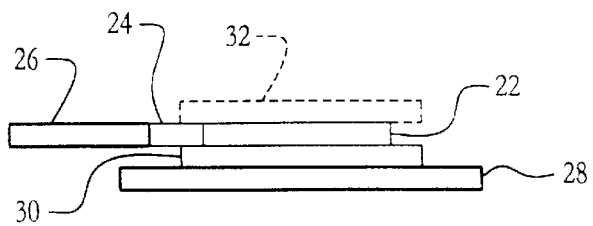
FIG. 4 is a side view of the heat sink configuration shown in FIG. 3.
Figure 8:
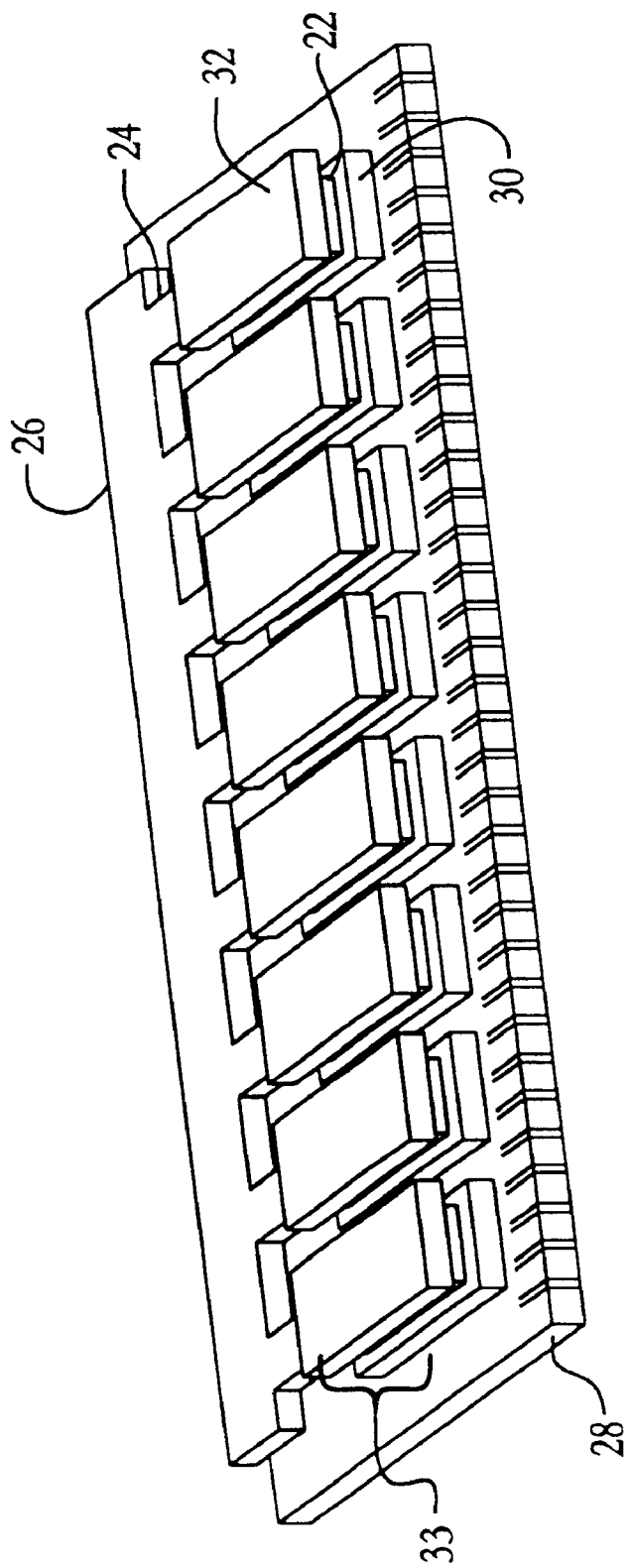
FIG. 8 is a perspective view of a preferred embodiment of the invention.

With reference to FIGS. 3, 4, and 8, heat sink 20 is utilized by placing each heat absorbing finger 22a–22h over a first layer chip 30 secured on a mounting surface 28 such as a plug-in board having edge connectors 27. A second layer of chips is then secured over each heat absorbing finger 22a–22h. Each finger 22a–22h may be affixed to the first and second layer chips 30, 32 using thermally conductivity enhancing mediums such as a thermal paste or epoxy. With reference to FIGS. 3 and 4, heat sink 20 is shown with each finger 22a–22h placed over a respective first layer chip 30 with the heat transfer elements 24a–24h and heat dissipating section 26 extending away from the location of the chips 30, 32. As shown in FIG. 8, a second layer of chips 32 is provided over the first layer of chips 30 with each respective finger 22a–22h positioned between each pair of first and second layer chips 30, 32. As shown, the heat transfer elements 24a–24h and heat dissipating section 26 are provided outside the chip stack 33 created by the first and second layers of chips 30, 32. In an alternative embodiment, the heat transfer elements 24a–24h may be provide so that at least a portion of the heat transfer elements 24a–24h lie within the chip stack 33.

Figure 5:
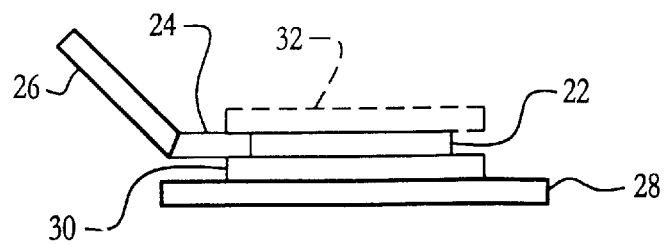
FIG. 5 is a side view of a first alternative heat sink configuration of the invention.
Figure 6:
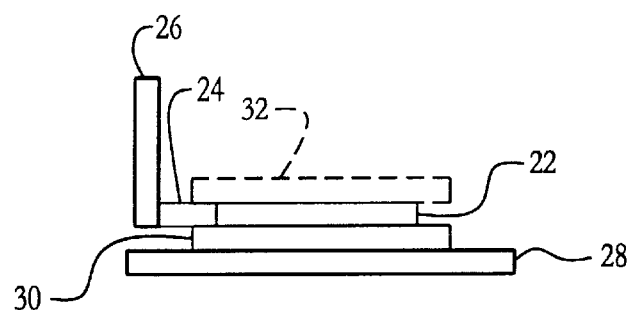
FIG. 6 is a side view of a second alternative heat sink configuration of the invention.
Figure 7:
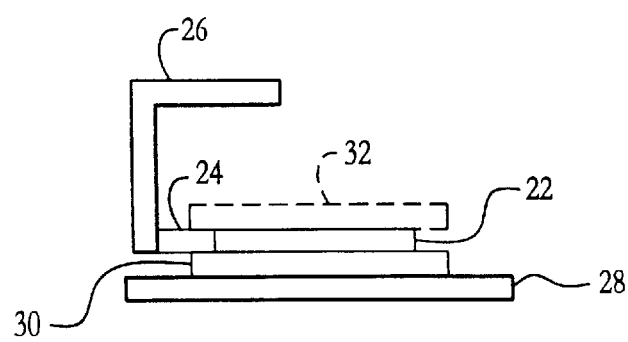
FIG. 7 is a side view of a third alternative heat sink configuration of the invention.

With reference to FIGS. 3, 4, and 8, the heat transfer and heat dissipating sections 24, 26 are shown provided coplanar with heat absorbing section 22. As shown in FIGS. 5–7, the heat transfer and heat dissipating sections 24, 26 may extend from the heat absorbing section 22 at any angle necessary to take advantage of unused space above and below the chip stack. With reference to FIG. 5, an alternative embodiment is shown in which heat dissipating section 26 is at approximately a 45 degree angle to the heat absorbing section 22. With reference to FIG. 6, an alternative embodiment is shown in which the heat dissipating section 26 is orthogonal to the heat absorbing section 22. With reference to FIG. 7, an alternative embodiment is shown in which the heat dissipating section 26 is initially orthogonal to the heat absorbing section 22 and then is bent again be in parallel with the heat absorbing section 22 at a point above the heat absorbing section.

Figure 9:
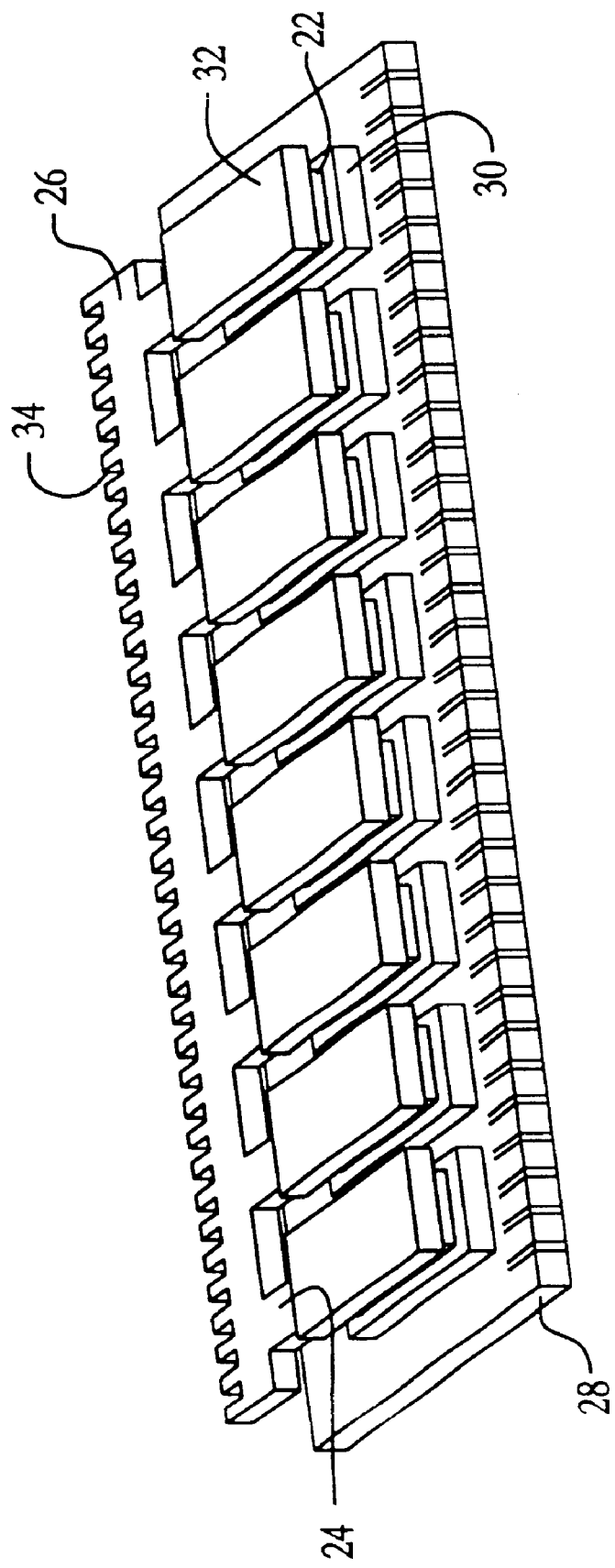
FIG. 9 is a perspective view of a fourth alternative embodiment of the invention.
Figure 10:
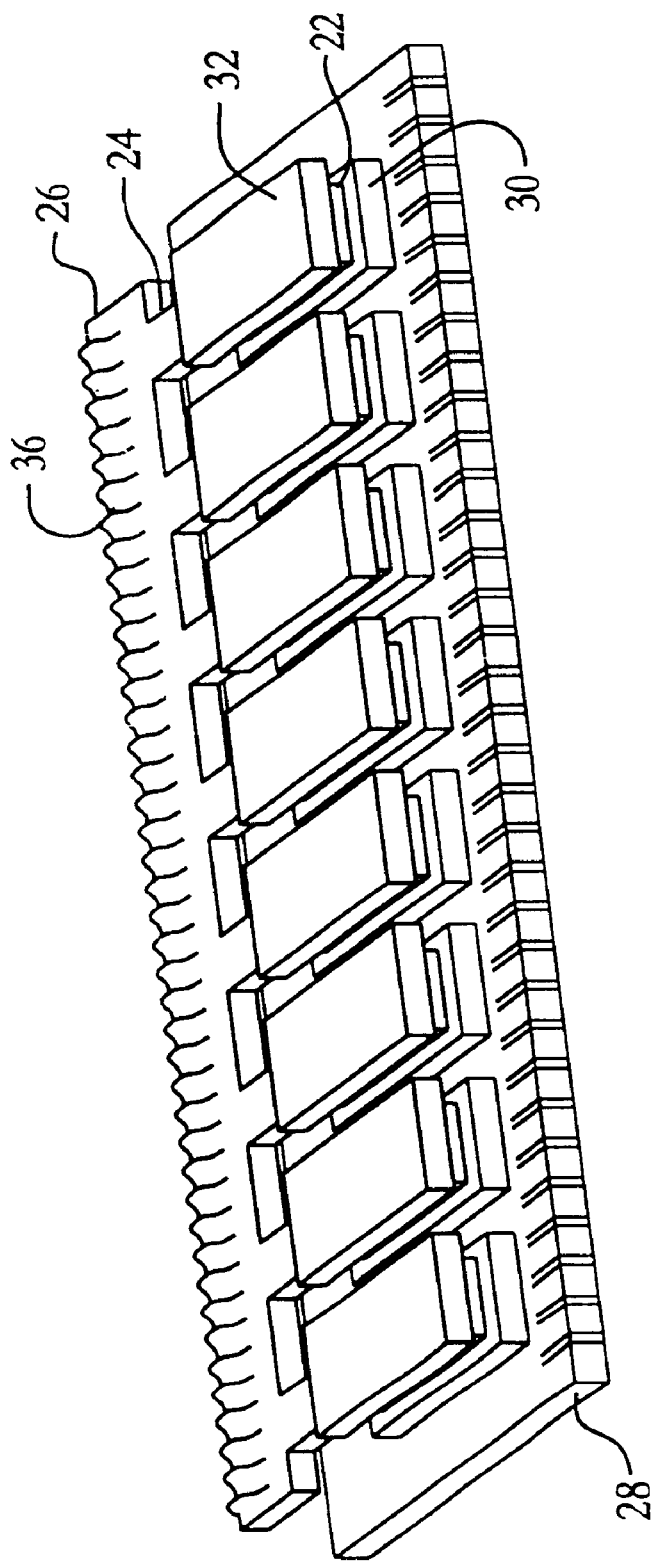
FIG. 10 is a perspective view of a fifth alternative embodiment of the invention.

With reference to FIG. 9, an alternative embodiment is shown in which the heat dissipating section 26 is comprised of heat dissipating fins 34 in order to further enhance heat dissipation by enlarging the surface area of section 26. With reference to FIG. 10, an additional alternative embodiment is shown in which the heat dissipating section 26 is formed as corrugation waves 36 in order to increase surface area and heat dissipation.

Figure 11:
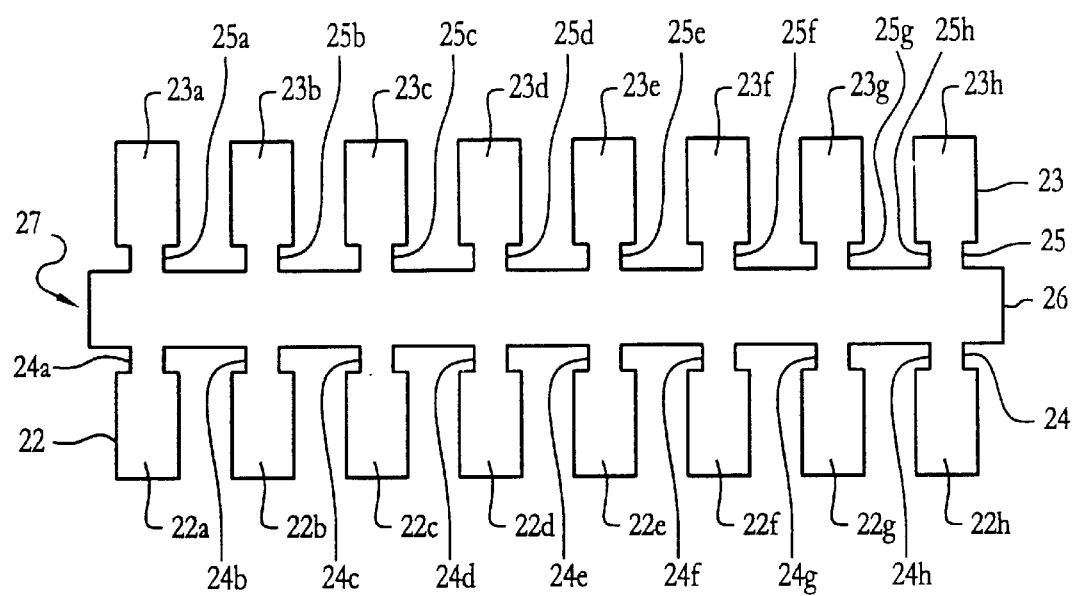
FIG. 11 is a perspective view of a sixth alternative embodiment of the invention.

With reference to FIG. 11, an alternative embodiment is shown in which heat sink 27 includes a heat dissipating section 26 in thermal contact with a pair of heat transfer sections 24, 25 and a pair of heat absorbing sections 22, 23, which extend along both sides of heat dissipating section 26. As shown in FIG. 11, heat transfer sections 24 and 25 respectively contain heat transfer elements 24a–24h and 25a–25h, and heat absorbing sections 22 and 23 respectively contain heat absorbing elements 22a–22h and 23a–23h.

Figure 12:
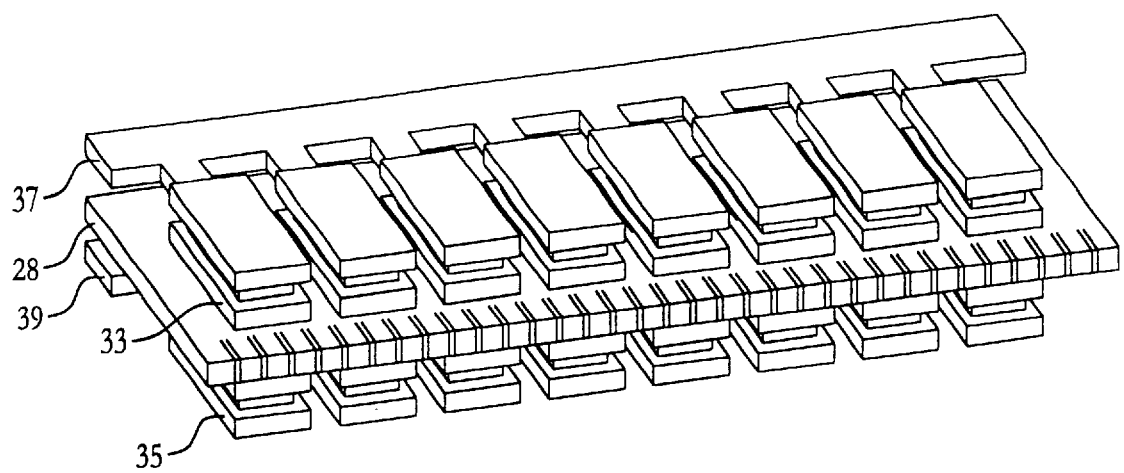
FIG. 12 is a perspective view of a second preferred embodiment of the invention.
Figure 13:
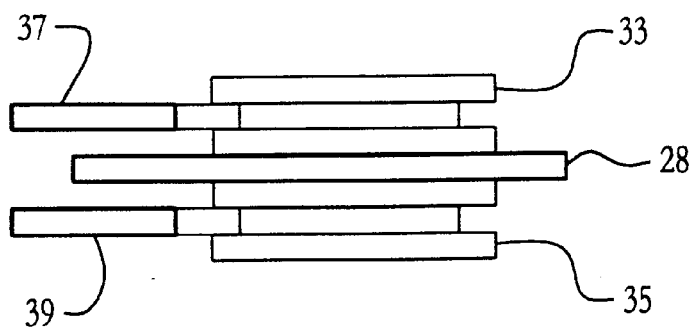
FIG. 13 is a side view of the second preferred embodiment shown in FIG. 12.
Figure 14:
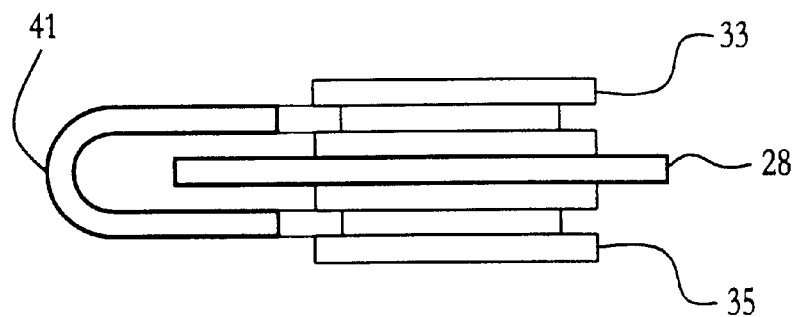
FIG. 14 is a side view of an alternative embodiment of the second preferred embodiment shown in FIGS. 12 and 13.

With reference to FIGS. 12 and 13, a second preferred embodiment is shown in which a pair of planar heat sinks 37, 39 are used together to dissipate heat from chip stacks 33, 35 positioned on each side of mounting surface 28. Alternatively, as shown in FIG. 14, a single continuous heat sink 41 may be used to dissipate heat from chip stacks 33, 35 positioned on each side of mounting surface 28.

One particular environment in which the heat sink of the invention may be used is within a memory module for a processor-based system. In this case, the integrated circuits 30, 32 may be integrated circuit memory devices such as DRAMS, SRAMS, EEPROM, etc. and the mounting surface 28 may be constructed as a plug-in board such as a SIMM (Single In-Line Memory Module), DIMM (Dual In-Line Memory Module), SO-SIMM (Small Outline-Single In-Line Memory Module), SO-DIMM (Small Outline-Dual In-Line Memory Module), RIMM (Rambus In-line Memory Module) or other plug-in module, for receipt in a system memory socket.

Figure 15:
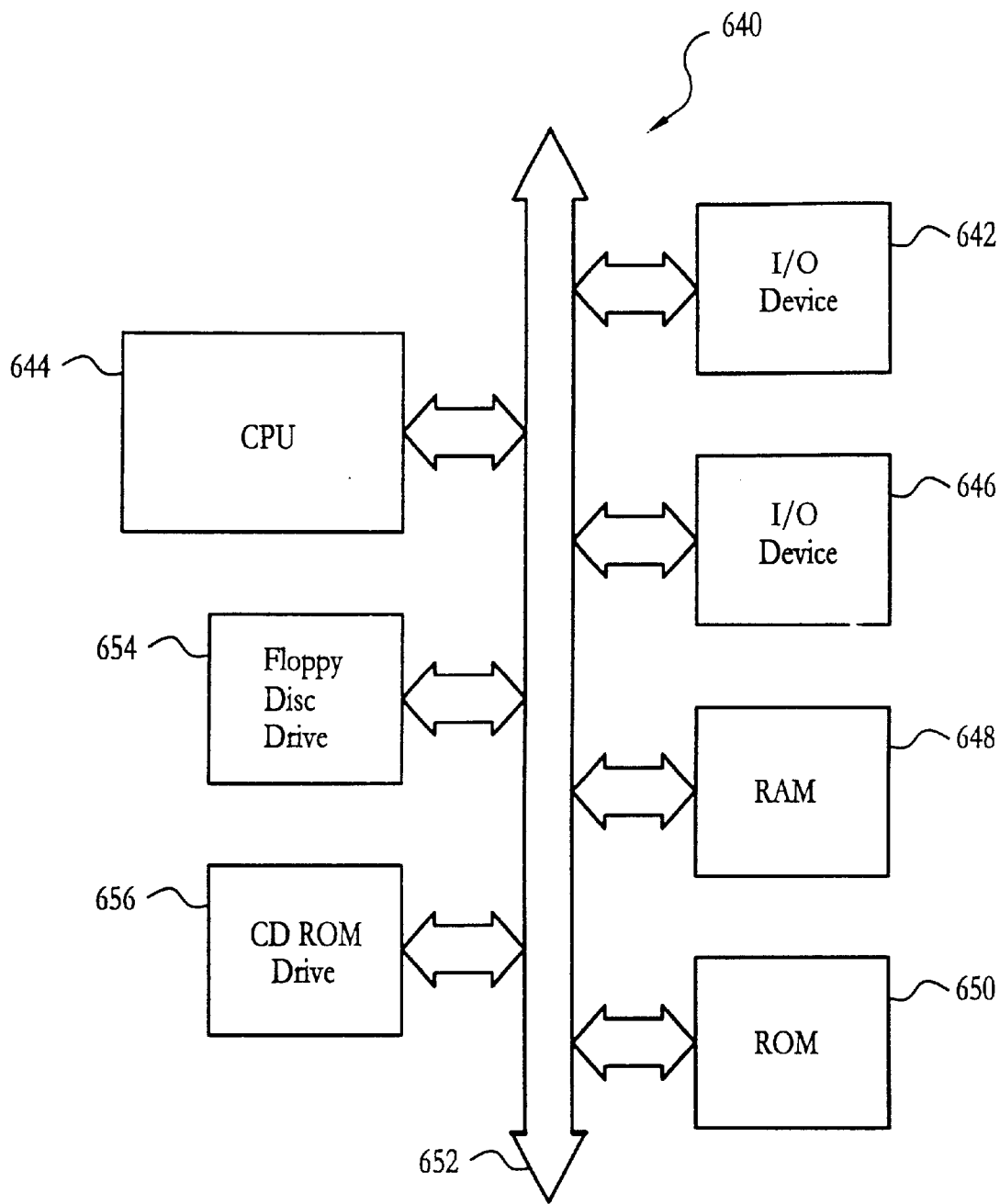
FIG. 15 is a block diagram of a processor system in which the invention may be utilized.

A typical processor-based system, which includes the present invention formed as a memory module, is illustrated generally at 640 in FIG. 15. A processor-based system typically includes a processor, which connects through a bus structure with memory modules, which contain data and instructions. The data in the memory modules is accessed during operation of the processor. This type of processor-based system is used in general purpose computer systems and in other types of dedicated processing systems, e.g. radio systems, television systems, GPS receiver systems, telephones and telephone systems to name a few.

Referring to FIG. 15, such a processor-based system generally comprises a central processing unit (CPU) 644, e.g. microprocessor, that communicates to at least one input/output (I/O) device 642 over a bus 652. A second (I/O) device 646 is illustrated, but may not be necessary depending upon the system requirements. The processor-based system 640 also may include a static or dynamic random access memory (SRAM, DRAM) 648 in the form of memory modules of the kind described and illustrated above, a read only memory (ROM) 650 which may also be formed in the form of memory modules of the kind described above. The processor-based system may also include peripheral devices such as a floppy disk drive 654 and a compact disk (CD) ROM drive 656, which also communicate with CPU 644 over the bus 652. It must be noted that the exact architecture of the processor-based system 600 is not important and that any combination of processor compatible devices may be incorporated into the system. Each of the memories 648 and 650 may be constructed as plug-in modules employing a heat sink constructed in accordance with the teachings of the invention.

The above description and accompanying drawings are only illustrative of preferred embodiments, which can achieve and provide the features and advantages of the present invention. It is not intended that the invention be limited to the embodiments shown and described in detail herein. For instance, the present invention is described only with respect to stack of two chips stacked vertically. Alternatively, the present invention may be used with any number of stacked chips, which may be stacked in a vertical, horizontal, or in side-by-side fashion. Accordingly, the invention is not limited by the foregoing description but is limited only by the spirit and scope of the appended claims.

What is claimed as new and desired to be protected by Letters Patent of the United States is:

1. A method of removing heat from stacked integrated circuits, said method comprising:

providing at least one heat absorbing section; said heat absorbing section having at least one planar extending element interposed between stacked integrated circuits;

providing a heat dissipation section; and, providing a heat transfer section interconnecting said heat absorbing section and said heat dissipating section, said heat transfer section having at least one heat transfer element connected to a respective planar extending element.

2. The method of claim 1, wherein said heat dissipating section contains a plurality of outwardly extended fins.

3. The method of claim 2, wherein said plurality of outwardly extending fins extend the length of said heat dissipating section.

4. The method of claim 1, wherein said heat dissipating section contains corrugations.

5. The method of claim 4, wherein said corrugations extend along the length of said heat dissipating section.

6. The method of claim 1, wherein said heat absorbing section is comprised of a plurality of planar extending elements each configured to be interposed between stacked integrated circuits, and said heat transfer section is comprised of a plurality of heat transfer elements respectively connected to said plurality of planar extending elements.

7. The method of claim 6, wherein said plurality of planar extending elements extend from opposite sides of said heat dissipating section.

8. The method of claim 7, wherein said heat absorbing section is comprised of a thermally conductive material having a thermal rate of expansion approximately equal to the thermal expansion rate of the stacked integrated circuits.

9. The method of claim 6, wherein at least one heat transfer element is the same width as at least one of said planar extending elements.

10. The method of claim 6, wherein at least one heat transfer element is narrower than at least one of said planar extending elements.

11. The method of claim 10, wherein at least one of said plurality of planar extending elements is rectangular.

12. The method of claim 6, wherein said heat absorbing section, said heat transfer section, and said heat dissipating section are coplanar.

13. The method of claim 6, wherein said heat absorbing section, said heat transfer section, and said heat dissipating section are not coplanar.

14. The method of claim 13, wherein said heat dissipating section is orthogonal to said heat absorbing section.

15. The method of claim 6, wherein at least one of said heat transfer elements is configured so that in use it is located outside said stacked integrated circuits.

16. The method of claim 6, wherein at least one of said heat transfer elements is configured so that in use it is located within said stacked integrated circuits.

17. A method for removing heat from a stacked integrated circuit, said method comprising:

providing a heat sink having a first portion configured to be interposed between two stacked integrated circuits and a second portion connected to said first portion for dissipating heat.

18. The method of claim 17, wherein said second portion includes a plurality of outwardly extended fins configured to remove heat from said heat sink.

19. The method of claim 17, wherein said second portion contains areas of corrugation.

20. The method of claim 17, wherein said heat sink is comprised of a thermally conductive material having a thermal rate of expansion approximately equal to the thermal expansion rate of the stacked integrated circuits.

21. The method of claim 17, wherein said first portion is comprised of a plurality of rectangular elements.

22. The method of claim 17, wherein said heat sink is substantially flat.

23. The method of claim 17, wherein said heat sink is not substantially flat.

24. The method of claim 17, wherein said heat sink is configured so that in use at least of portion of said heat sink is located outside said stacked integrated circuits.

25. The method of claim 17, wherein said heat sink is configured so that in use at least of portion of said heat sink is located within said stacked integrated circuits.

* * * * *